(12) United States Patent
Anton et al.

(10) Patent No.: US 11,175,326 B2
(45) Date of Patent: Nov. 16, 2021

(54) METHOD AND MEASUREMENT SYSTEM FOR OVER-THE-AIR MEASUREMENTS

(71) Applicant: Rohde & Schwarz GmbH & Co. KG, Munich (DE)

(72) Inventors: Juan-Angel Anton, Munich (DE); Hendrik Bartko, Munich (DE); Bernhard Rohowsky, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 190 days.

(21) Appl. No.: 16/533,285

(22) Filed: Aug. 6, 2019

(65) Prior Publication Data

US 2020/0088775 A1 Mar. 19, 2020

(30) Foreign Application Priority Data

Sep. 18, 2018 (EP) .................................... 18195286

(51) Int. Cl.
*G01R 29/10* (2006.01)
(52) U.S. Cl.
CPC .................................... *G01R 29/10* (2013.01)
(58) Field of Classification Search
CPC ......... H04B 17/12; H04B 17/21; H04B 17/27
See application file for complete search history.

(56) References Cited

U.S. PATENT DOCUMENTS

| 2009/0160706 | A1 | 6/2009 | Oh et al. | |
| 2009/0284425 | A1 | 11/2009 | Snow et al. | |
| 2009/0284426 | A1* | 11/2009 | Snow | G01R 29/10 343/703 |
| 2010/0090915 | A1* | 4/2010 | Benavides | G01R 29/10 343/703 |
| 2010/0123624 | A1* | 5/2010 | Minear | H04B 7/084 342/372 |
| 2011/0084887 | A1* | 4/2011 | Mow | G01R 29/10 343/703 |

(Continued)

FOREIGN PATENT DOCUMENTS

| CN | 103323489 B | 1/2012 |
| CN | 105842670 A | 8/2016 |

(Continued)

OTHER PUBLICATIONS

Author: Angelilli, et al. Title: Accurate Cylindrical Near-Field Measurements on Large Size Conformal Antennas (Year: 2017).*

(Continued)

*Primary Examiner* — Alvaro E Fortich
(74) *Attorney, Agent, or Firm* — Christensen O'Connor Johnson Kindness PLLC

(57) ABSTRACT

A method for performing active over-the-air measurements of a device under test with an antenna is described. The device under test with the antenna is provided. The device under test is arranged randomly in a measurement zone assigned to a measurement antenna. The phase center of the antenna of the device under test is determined. Measurement positions for the active over-the-air measurements are calculated that depend on an offset between the phase center determined and a center of the measurement zone. Further, a measurement system for over-the-air measurements is described.

21 Claims, 2 Drawing Sheets

(56) References Cited

U.S. PATENT DOCUMENTS

| | | | | |
|---|---|---|---|---|
| 2013/0093447 A1* | 4/2013 | Nickel | ............... | H04W 24/06 |
| | | | | 324/750.16 |
| 2013/0300616 A1* | 11/2013 | Reed | ............... | G01R 29/10 |
| | | | | 343/703 |
| 2015/0260772 A1* | 9/2015 | Aubin | ............... | G01R 29/10 |
| | | | | 343/703 |
| 2018/0227060 A1* | 8/2018 | Mellein | ............... | G01R 29/10 |

FOREIGN PATENT DOCUMENTS

| | | |
|---|---|---|
| CN | 106019247 A | 10/2016 |
| CN | 207440189 U | 6/2018 |
| EP | 3273257 A1 | 1/2018 |

OTHER PUBLICATIONS

Harima, K., "Evaluating the Effectiveness of Applying the Phase Center for Antenna Measurements," Proceedings of 2017 IEEE GAMA, Tsukuba, Japan, pp. 61-64, Dec. 2017.

Angelilli, M., et al., "Accurate Cylindrical Near-Field Measurements on Large Size Conformal Antennas," 2017 IEEE International Workshop on Metrology for AeroSpace (MetroAeroSpace), pp. 351-354, Jun. 2017.

Pan, S., et al., "Investigation of a Wideband BiCMOS Fully On-Chip W-Band Bowtie Slot Antenna," IEEE Antennas and Wireless Propagation Letters (12):706-709, May 21, 2013.

Rhode & Schwarz: "Precise Antenna Characterization," News 211/ 14, 2014, 68 pages.

\* cited by examiner

METHOD AND MEASUREMENT SYSTEM FOR OVER-THE-AIR MEASUREMENTS

TECHNICAL FIELD

Embodiments of the present disclosure relate to a method for performing active over-the-air measurements of a device under test with an antenna. Further, embodiments of the present disclosure relate to a measurement system for over-the-air measurements of a device under test with an antenna.

BACKGROUND

Active over-the-air (OTA) measurements such as total radiated power (TRP) measurements and total isotropic sensitivity (TIS) measurements are known in the state of the art wherein the device under test to be measured has to be positioned exactly within a measurement zone so that the phase center of an antenna of the device under test coincidences with the center of the measurement zone. The phase center, according to antenna design theory, corresponds to the point from which electromagnetic radiation spreads spherically outwards, with the phase of the signal being equal at any point on the sphere.

Irrespective of the difficulty to arrange the device under test in the center of the measurement zone, the phase center of the antenna of the device under test is unknown at the beginning so that the phase center has to be determined initially. Afterwards, the device under test has to be re-positioned at least once so that the phase center of the antenna of the device under test, also called DUT antenna, is arranged in the center of the measurement zone. In real applications, the device under test has to be re-positioned several times which results in a cumbersome measurement process of the device under test.

Therefore, those active over-the-air measurements are complicated and expensive for large devices under test since (re-)positioning a large device under test, for instance a car, a ship or a plane, is cumbersome and lasts long so that fast measurements are not feasible. In addition, the measurement facilities, for instance a hall or rather a hanger, has to have an appropriate size for accommodating the large device under test. In fact, the measurement zone needs to be at least double of the length of the device under test.

Hence, testing a device under test, in particular a large device under test, is time-consuming and, therefore, the costs are high.

SUMMARY

Accordingly, there is a need for a cost-efficient possibility to measure a particularly large device under test over-the-air.

The present disclosure provides methods for performing active over-the-air measurements of a device under test with an antenna. In an embodiment, the method includes the following steps:

providing the device under test with the antenna;

arranging the device under test randomly in a measurement zone assigned to a measurement antenna;

determining the phase center of the antenna of the device under test; and calculating measurement positions for the active over-the-air measurement that depend on an offset between the phase center determined and a center of the measurement zone.

Further, the present disclosure provides measurement systems for over-the-air measurements of a device under test with an antenna. In an embodiment, the system comprises a measurement zone, a measurement antenna assigned to the measurement zone, a positioning system and a processing unit, wherein the positioning system is configured to vary the relative position and/or the relative orientation of the measurement antenna with respect to the device under test placed in the measurement zone;

wherein the processing unit is configured to determine the phase center of the antenna of the device under test; and wherein the processing unit is further configured to calculate measurement positions for the active over-the-air measurement of the device under test, which depend on an offset between the phase center determined and a center of the measurement zone.

Accordingly, the active over-the-air measurement of the device under test, for instance at least one of a total radiated power (TRP) measurement and a total isotropic sensitivity (TIS) measurement, can be performed in a simplified manner since the device under test having the antenna, namely the DUT antenna, can be arranged in the measurement zone randomly or rather at a randomly chosen position in the measurement zone. Therein and in the following, the terms "randomly chosen position", random arrangement" etc. are to be understood to mean that the position in the measurement zone is arbitrary. This may mean, but does not necessarily mean that the position is chosen by chance. The device under test is rather put into the measurement zone without having to pay particular attention to the exact positioning. This means that it is not required that the antenna of the device under test is exactly positioned in the center of the measurement zone so that re-positioning or rather re-arranging the device under test in the measurement zone is no more necessary. For instance, the exact alignment is not required since the measurement positions for the active over-the-air measurement are calculated taking the offset into account that is present between the phase center of the antenna of the device under test and the center of the measurement zone.

The center of the measurement zone may be known previously due to the design of the measurement system, for example the measurement zone. However, the phase center of the antenna of the device under test is calculated.

The respective active over-the-air measurement may require a sampling of the device under test according to a certain pre-defined pattern with several measurement locations which means that several measurements are done at locations relating to the pre-defined pattern. Typically, the measurement zone may be a circular one wherein, under ideal conditions, a sampling takes place regularly after a certain angular distance. In other words, a sampling every specific angle is required by the pre-defined pattern. For instance, a TRP measurement requires a sampling every 15 degrees. Thus, the measurement antenna and the antenna of the device under test may rotate with respect to each other so as to reach the different measurement locations according to the pre-defined pattern. In general, the ideal conditions correspond to the arrangement of the phase center of the DUT antenna in the center of the measurement zone, which is tried to obtain in the state of the art by re-positioning the device under test several times prior to the measurement.

In contrast to the state of the art, the device under test, for example the phase center of the respective antenna, is arranged randomly in the measurement zone so that the offset between the center of the measurement zone and the phase center of the DUT antenna is present. In other words, no ideal conditions are obtained. Therefore, the measurement locations of the pre-defined pattern have to be adapted in dependence of the offset determined previously so as to obtain the measurement positions used for the OTA measurement. The measurement positions obtained relate to the calculated ones.

The measurement positions calculated are spaced from each other in a non-equidistant manner, namely at different certain angular distances, due to the offset. In fact, the angular distance between adjacent measurement positions vary. In other words, a translation of the measurement locations of the pre-defined pattern is done according to which the active over-the-air measurement has to be performed. Thus, translated measurement locations, namely the measurement positions, are calculated based on the pre-defined pattern of the respective measurement intended and the offset that occurs due to the random arrangement of the device under test in the measurement zone.

Put it another way, the center of the pre-defined pattern is shifted to the phase center of the antenna being determined previously whereas the intersections of the circumference of the measurement zone and the pre-defined pattern, namely lines originating from the phase center of the antenna of the device under test spaced from each other by regular angular distances according to the specific pre-defined pattern applied, define the measurement positions to be used by the OTA measurement.

Once the measurement positions for the over-the-air measurement have been calculated, the active OTA measurement at the respective measurement positions is conducted. Thus, a relative movement between the device under test and the measurement antenna takes place so that the different measurement positions calculated are reached for sampling purposes. In fact, at each measurement position calculated, a sample is recorded.

According to an aspect, a correction factor depending on the geometric path length between the measurement antenna and the antenna of the device under test is determined. The geometric path length corresponds to the real geometric distance between the measurement antenna and the antenna of the device under test. The respective correction factor is determined so that a distance compensation due to the offset between the phase center and the center of the measurement zone can be compensated appropriately. The offset yields in different distances between the measurement antenna and the antenna of the device under test during the OTA measurement, namely at the different measurement positions.

For compensating purposes, the correction factor may be applied so that the offset between the phase center determined and the center of the measurement zone is compensated. Therefore, the measurement results obtained at the different measurement positions are standardized so that they can be compared with each other. Put it another way, the measurement results obtained are adapted in such a manner as if the phase center coincidences with the center of the measurement zone. Hence, the measurement results obtained are transformed as being obtained under ideal conditions.

For instance, the correction factor is determined and applied by the processing unit so that the processing unit is configured to determine and to apply the correction factor. Hence, the processing unit processes the measurement results obtained so as to determine the characteristics of the device under test under ideal conditions.

In some embodiments, the geometric path length depends on measured measurement values, for instance a power level. Thus, the geometric path length is obtained by taking the different measurement values into account that have been retrieved previously. For instance, the measurement values have been obtained during the determination of the phase center.

According to another aspect, a minimum far-field distance of the antenna of the device under test is determined. The processing unit may be configured to determine the minimum far-field distance of the antenna of the device under test. This ensures that it can be verified whether or not the active over-the-air measurement is performed in the far-field of the respective antenna which corresponds to a real environment application of the device under test. In some embodiments, the minimum far-field distance determined is compared with a minimum distance between the antenna of the device under test and the measurement antenna. For instance, the processing unit is configured to compare the minimum far-field distance determined with the minimum distance between the antenna of the device under test and the measurement antenna. Accordingly, it can ensured that the device under test is always measured under far-field conditions provided that the minimum distance, namely the real minimum distance between the antenna of the device under test and the measurement antenna, is larger than the minimum far-field distance determined. In other words, the minimum far-field distance determined has to be met during the OTA measurement in order to ensure that far-field over-the-air measurement conditions are applied.

Accordingly, the measurement positions for the active over-the-air measurement may be calculated and/or adapted such that they are located in the far-field region of the antenna of the device under test, for instance in an inner region of the far-field (e.g., in a border area of the far-field region being adjacent to a Fresnel-region of the antenna of the device under test). Due to the random placement of the device under test, one or more measurement antennas may initially be placed in the near-field region or in the Fresnel-region. Thus, determining the minimum far-field distance of the device under test ensures that the OTA measurements are performed in the far-field region.

For this purpose, a distribution of equivalent electrical currents or rather an electric current on a fictitious surface encompassing the device under test may be determined. This electric current or rather the distribution, once determined, can be used to ascertain the near field and the far-field of the measurement antenna. Put it another way, an active area of the antenna of the device under test can be determined.

Moreover, the relative position and/or the relative orientation of the measurement antenna with respect to the device under test placed in the measurement zone are/is varied during the active over-the-air measurement, in particular the relative angular orientation, for instance azimuth and/or elevation. For instance, the positioning system is configured to vary the relative angular orientation between the measurement antenna and the device under test placed in the measurement zone, in particular azimuth and/or elevation. The respective over-the-air measurement is done according to a pre-defined pattern which requires a certain sampling with regard to the angular orientation. For instance, a TRP measurement may require an azimuth and elevation sampling every 15 degrees. Thus, the respective measurement points, namely the translated measurement locations due to the offset, are used appropriately which in turn results in varying the relative position and/or the relative orientation continuously so as to reach the measurement positions.

According to another aspect, the positioning system comprises a rotating disc assigned to the measurement zone and/or a rotating gantry arm assigned to the at least one measurement antenna. The rotating disc, also called a turntable, can be used for adjusting the azimuth whereas the rotating gantry arm may be used for adapting the elevation. Thus, the positioning system may comprise at least two different components which are assigned to different components of the measurement system, namely the measurement zone as well as the measurement antenna.

The measurement positions may establish a measurement grid. The measurement grid relates to the translated pattern that was pre-defined by the respective over-the-air measurement intended for testing the device under test. Usually, the pattern comprises regularly or rather evenly distributed measurement locations whereas the grid comprises irregularly or rather unevenly distributed measurement positions due to the offset between the phase center and the center of the measurement zone.

Generally, the measurement positions calculated may differ from each other in at least one of azimuth and elevation. Hence, each measurement position is obtained by performing a relative movement between the measurement antenna and the device under test, namely with regard to at least one of elevation and azimuth.

According to another aspect, the phase center of the antenna of the device under test is determined by measuring a two-dimensional and/or a three-dimensional pattern. Thus, different measurement values are obtained when performing measurements according to the respective pattern. The measurement values are evaluated appropriately in order to determine the phase center of the antenna of the device under test. The different measurements may be done by using the measurement antenna. A relative movement between the measurement antenna and the measurement zone may be initiated wherein measurements are taken for determining the phase center of the antenna of the device under test. The relative movement may be initiated by moving the antenna around the device under test and/or rotating the device under test.

For instance, the processing unit is configured to process the measurement data received in order to determine the phase center of the antenna of the device under test. Thus, the respective information for determining the phase center is obtained by the measurement antenna wherein the measurement data relates to measuring a two-dimensional and/or a three-dimensional pattern with regard to the device under test so as to determine the phase center of the antenna of the device under test.

Generally, the two-dimensional pattern may relate to a relative circular movement of the measurement antenna with respect to the device under test whereas the three-dimensional pattern additionally comprises a movement in elevation.

According to an aspect, the processing unit is connected with the measurement antenna so that the processing unit receives measurement data from the measurement antenna. The processing unit corresponds to the main component of the measurement system since it is used to process the data obtained, for instance the measurement data obtained from the measurement antenna, and to evaluate the data obtained appropriately. Moreover, the processing unit may do corrections and/or compensations.

The measurement system may further comprise a control unit for controlling the positioning system.

In some embodiments, the processing unit and the control unit may be provided by separately formed devices. Alternatively, the processing unit and the control unit may be provided by a common device, namely a processing and control device. The processing unit, the control unit, and/or the processing and control device may be implemented in software or in hardware or in a combination of software and hardware. In some embodiments, the methodology or technology of the processing unit, the control unit, and/or the processing and control device or components thereof is carry out by circuitry, such as digital circuitry, analog circuitry or the like. In other embodiments, the methodology or technology of the processing unit, the control unit, and/or the processing and control device or components thereof is carry out by programmable circuits, programmed processors, or the like.

In general, the measurement system may be configured to perform the method described above.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
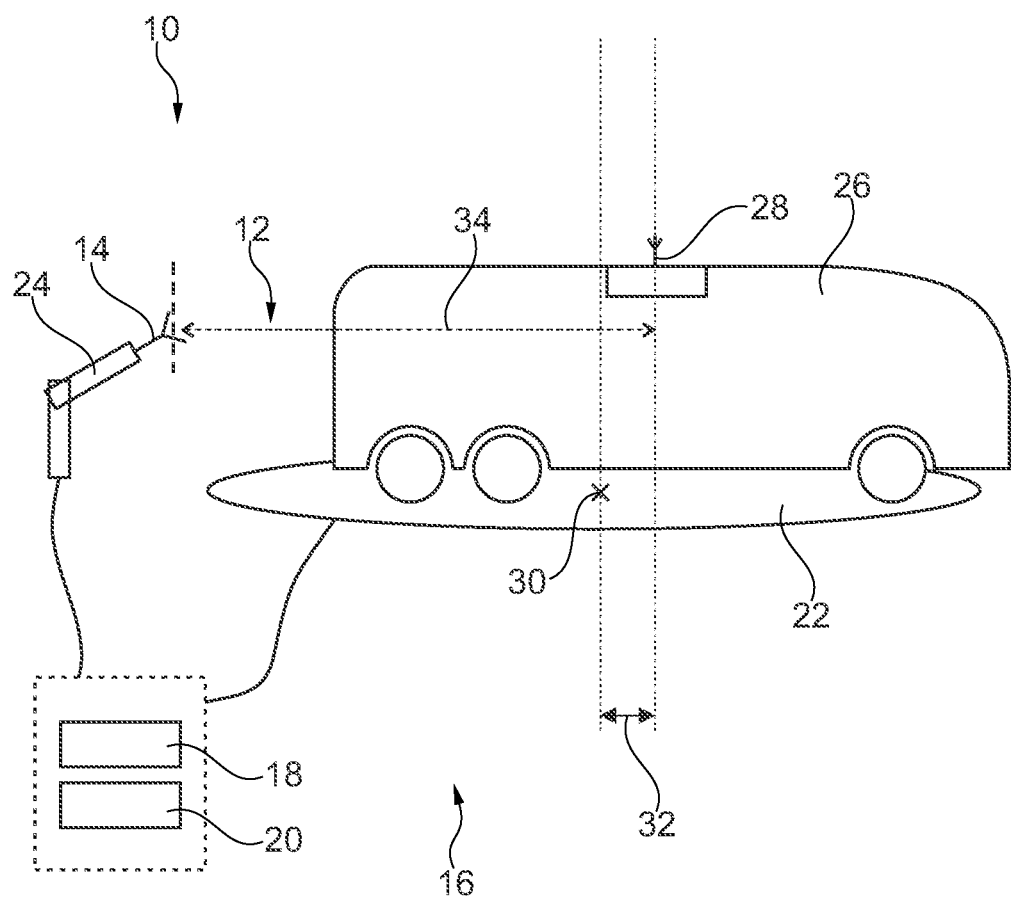
FIG. 1 schematically shows a measurement system according to the present disclosure.

In FIG. 1, a measurement system 10 for over-the-air measurements is schematically shown. The measurement system 10 comprises a measurement zone 12 as well as a measurement antenna 14 that is assigned to the measurement zone 12.

The measurement system 10 also comprises a positioning system 16 as well as a processing unit 18 that is inter alia connected with the measurement antenna 14 for retrieving information received by the measurement antenna 14. The measurement system 10 further includes a control unit 20 that is connected with the processing unit 18 as well as the positioning system 16. Thus, the control unit 20 may control the positioning system 16 based on a command issued by the processing unit 18.

Generally, the processing unit 18 and the control unit 20 may be provided by separate devices in some embodiments, or in other embodiments may be provided by a common device, for instance a processing and control device, as exemplary shown in FIG. 1.

In the shown embodiment, the positioning system 16 comprises a rotating disc 22, also called a turntable, that is assigned to the measurement zone 12. Moreover, the positioning system 16 has a rotating gantry arm 24 that is assigned to the at least one measurement antenna 14. In some embodiments, the measurement antenna 14 is held by the rotating gantry arm 24 so that the measurement antenna 14 can be moved. appropriately Accordingly, the measurement antenna 14 is movable.

In general, a device under test 26 to be tested having an antenna 28, also called DUT antenna, is arranged in the measurement zone 12 as indicated in FIG. 1 showing a bus used as the device under test 26. Hence, the device under test 26, namely the bus, is placed on the rotating disc 22 so that the device under test 26 can be rotated by controlling the positioning system 16. In some embodiments, the control unit 20 controlling the positioning system 16 controls the rotating disc 22 as well as the rotating gantry arm 24 individually. To carry out this functionality in some embodiments, the rotating disc 22 and/or the gantry arm 24 includes or is associated with one or more electric motors, such as a stepper motor or the like.

Figure 2:
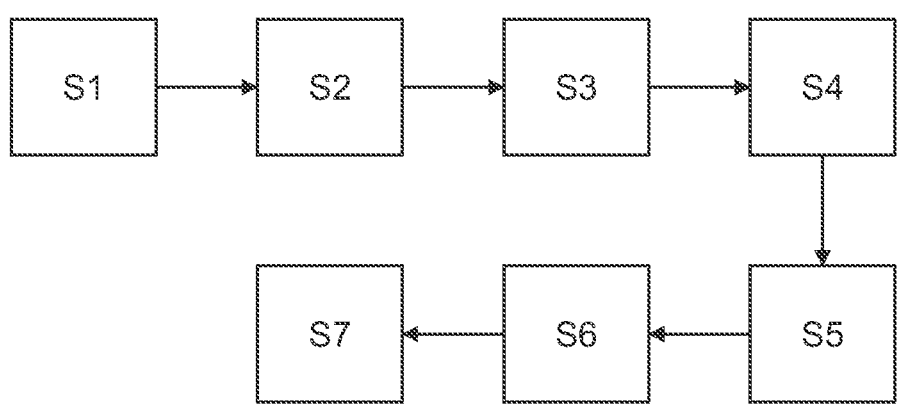
FIG. 2 shows a flow-chart illustrating a method for performing active over-the-air measurements according to the present disclosure.

Hereinafter, the functionality of the measurement system 10 will be described while taking the flow-chart of FIG. 2 into account illustrating a method for performing over-the-air measurements of the device under test 26 while using the measurement system 10 shown in FIG. 1.

In a first step S1 the device under test 26 with the antenna 28 is provided (as well as the measurement system 10).

In a second step S2, the device under test 26 is randomly arranged in the measurement zone 12 that is assigned to the measurement antenna 14. This means that the device under test 26 can be placed at a randomly chosen location in the measurement zone 12.

Therein and in the following, the terms "randomly chosen position", random arrangement" etc. are to be understood to mean that the position in the measurement zone is arbitrary. This may mean, but does not necessarily mean that the position of the device under test 26 in the measurement zone 12 is chosen by chance. The device under test 26 is rather put into the measurement zone 12 without having to pay particular attention to the exact positioning.

Hence, the device under test 26 as well as the phase center of the antenna 28 may be positioned distanced to a center 30 of the measurement zone 12 as indicated in FIG. 1. In other words, the device under test 26 may be arranged in the measurement zone 12 such that an offset 32 occurs between the phase center of the antenna 28 and the center 30 of the measurement zone 12 which is also shown in FIG. 1.

In a third step S3, the phase center of the antenna 28 of the device under test 26 is determined. This can be done by measuring a two-dimensional or rather a three-dimensional pattern around the antenna 28 of the device under test 26 so as to obtain different measurement values. For doing so, the device under test 26 may be rotated with respect to the measurement antenna 14. Alternatively, the measurement antenna 14 may be rotated around the device under test 26. The relative rotation ensures to sample a two-dimensional pattern. Optionally, the elevation may be taken into account so as to obtain a three-dimensional pattern.

In general, the two-dimensional or three-dimensional pattern may be measured by using the measurement antenna 14 as well as the positioning system 16 that are controlled by the control unit 20 in an appropriate manner.

In other words, the rotating disc 22 as well as the rotating gantry arm 24 are controlled by the control unit 20 appropriately so that the two- or rather three-dimensional pattern is sampled that is used for obtaining the measurement values required to determine the phase center of the antenna 28.

Then, the values obtained are processed by the processing unit 18 so that the phase center of the antenna 28 can be determined. In some embodiments, the processing unit 18 receives the respective measurement data from the measurement antenna 14 to which the processing unit 18 is connected.

In a fourth step S4, measurement positions for the active over-the-air measurement are calculated that depend on the offset 32 between the phase center of the antenna 28 determined and the center 30 of the measurement zone 12 that is known by design or rather determined previously. The measurement positions are calculated based on a pre-defined pattern or rather a standard with respect to the phase center of the antenna 28 as well as the offset 32. Usually, the pre-defined pattern or rather the standard relates to ideal conditions according to which the center 30 of the measurement zone 12 coincidences with the phase center such that no offset occurs.

However, as an offset 32 is present, different sampling points or rather sampling locations are calculated for the respective active over-the-air measurement intended that correspond to translated measurement locations of the pre-defined pattern.

Figure 3A:
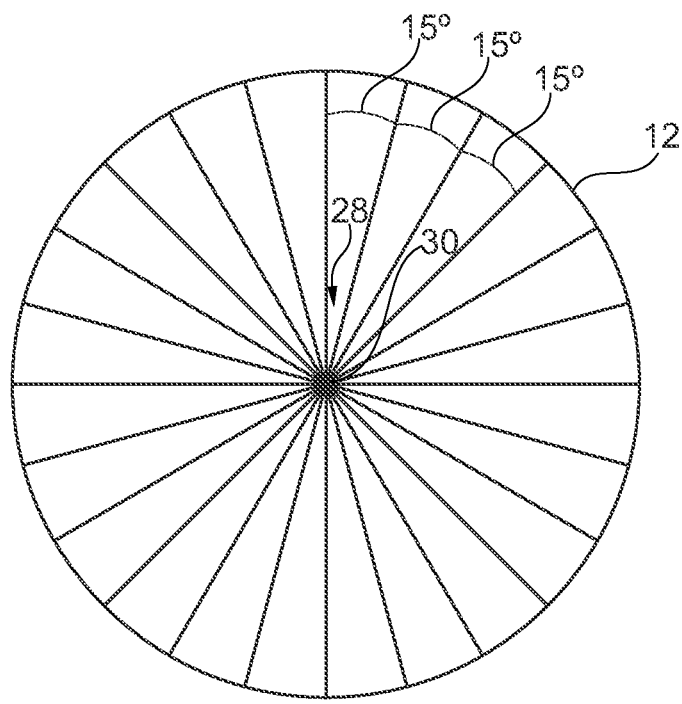
FIG. 3a shows a schematic overview illustrating the measurement locations under ideal conditions.

In some embodiments, the measurement locations of the pre-defined pattern are typically spaced from each other by regular angular distances along the circumference of the measurement zone 12, namely the rotating disc 22. This is indicated exemplary in FIG. 3a showing a pre-defined pattern for ideal conditions with 15° angular distance between adjacent measurement locations. As mentioned earlier, the ideal conditions correspond to the center 30 coinciding with the phase center of the antenna 28.

The calculated measurement positions (under real conditions) are assigned to these measurement locations wherein the angular distance is varied as the phase center does not coincidence with the center 30 of the measurement zone 12 due to the randomly chosen position for the device under test 26. Accordingly, the measurement locations according to the pre-defined pattern are translated so that measurement positions are obtained that are also spaced from each other along the circumference of the rotating disc 22 or rather the turntable, but with different angular distances between adjacent measurement positions. This is shown in FIG. 3b illustrating the offset 32.

In other words, the center of the pre-defined pattern is shifted to the phase center of the antenna 28 being determined previously. Then, the measurement positions are calculated by the intersections of the circumference of the measurement zone 12, for instance the rotating disc 22, and the pre-defined pattern, namely lines originating from the phase center of the antenna 28 of the device under test 26 spaced from each other by regular angular distances according to the specific pre-defined pattern applied, define the measurement positions that are later used by the OTA measurement.

Figure 3B:
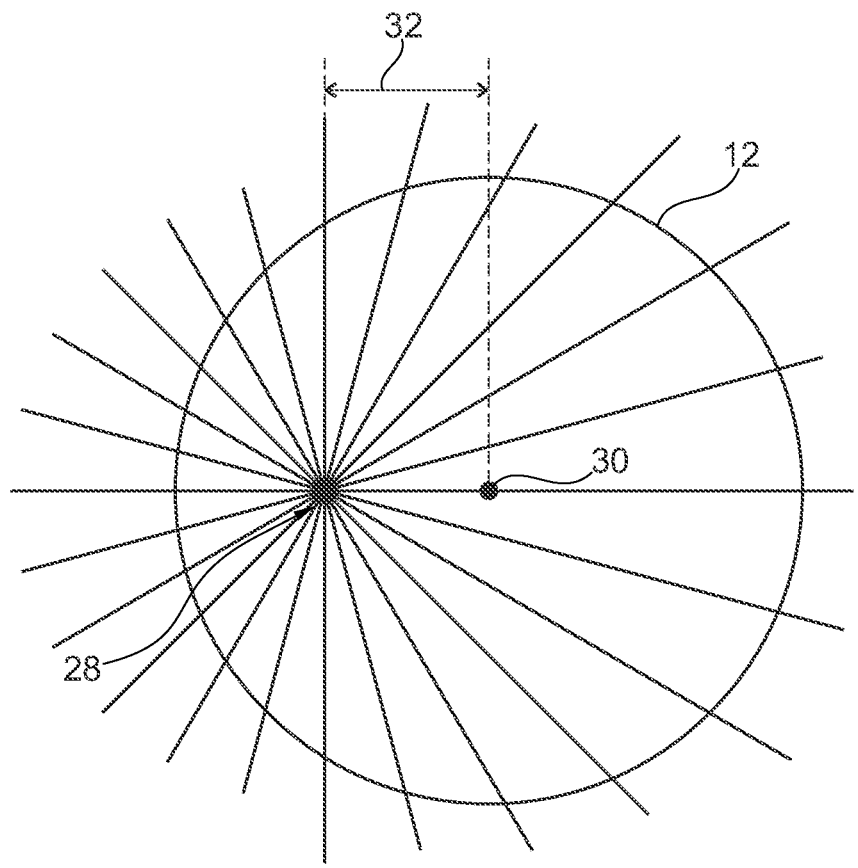
FIG. 3b shows a schematic overview illustrating the measurement positions calculated by using a method for performing active over-the-air measurements according to the present disclosure.

This becomes apparent by comparing FIGS. 3a and 3b. In FIG. 3b, the respective measurement positions correspond to the intersection points of the circle, illustrating the measurement zone 12, and the lines originating from the phase center of the antenna 28.

In general, the measurement positions differ from each other in at least one of azimuth and elevation.

Since the device under test 26 is randomly arranged in the measurement zone 12, the offset 32 between the phase center and the center 30 of the measurement zone 12 occurs that is taken into account for calculating the different measurement positions for the active over-the-air measurement, namely the sampling positions. In other words, the measurement locations of the pre-defined pattern are translated to the measurement positions due to the offset 32.

The measurement positions calculated establish a measurement grid that relates to the pre-defined pattern while taking the offset 32 into account so that the measurement grid comprising the measurement positions corresponds to a translated pre-defined pattern.

In a fifth step S5, the active over-the-air measurement is conducted at the respective measurement positions calculated wherein the relative position and/or the relative orientation of the measurement antenna 14 with respect to the device under test 26 arranged randomly in the measurement zone 12 are/is varied appropriately.

In some embodiments, the positioning system 16 is controlled by the control unit 20 during the OTA measurement so that the rotating disc 22 may rotate and/or the rotating gantry arm 24 may rotate in order to reach the different measurement positions calculated. Accordingly, the relative angular orientation between the measurement antenna 14 and the device under test 26 is varied during the OTA measurement, namely in azimuth and/or elevation.

In a sixth step S6, a correction factor is determined that depends on a geometric path length 34 between the measurement antenna 14 and the antenna 28 of the device under test 26, namely the distance between the antenna 28 and the measurement antenna 14.

In some embodiments, the geometric path length 34 can be determined based on measured measurement values, for instance a power level of the signal(s) received by the measurement antenna 14. Thus, the geometric path length 34, namely the distance between the measurement antenna 14 and the antenna 28, is determined indirectly so that it is not necessary to directly measure the length or rather the distance.

Alternatively, the geometric path length 34 between the measurement antenna 14 and the antenna 28 of the device under test 26 is measured directly, for instance by a distance sensor such as a laser.

The respective correction factor determined is applied so that the offset 32 between the phase center of the antenna 28 and the center 30 of the measurement zone 12 can be compensated.

Thus, the measurement results obtained by the active over-the-air measurement are converted into measurement results that would have been obtained if the device under test 26 was arranged in the center 30 of the measurement zone 12 at the beginning. Hence, the measurement results obtained are transformed into measurement results as being obtained under ideal conditions, namely when the phase center coincidences with the center 30 of the measurement zone 12.

In an optional step that may take place after step S3, a minimum far-field distance of the antenna 28 of the device under test 26 is determined wherein the minimum far-field distance determined is compared with a minimum distance between the antenna 28 of the device under test 26 and the measurement antenna 14.

Accordingly, the measurement positions for the active over-the-air measurement may be calculated and/or adapted such that they are located in the far-field region of the antenna 28 of the device under test 26, for instance in an inner region of the far-field (e.g., in a border area of the far-field region being adjacent to a Fresnel-region of the antenna 28 of the device under test 26).

Hence, it can be verified whether or not the respective over-the-air measurement is performed in the far-field of the antenna 28.

In general, the device under test 26 can be measured in an active manner over-the-air in a cost-efficient manner since the measuring time as well as the measurement efforts are reduced. In fact, the device under test 26 may be placed randomly in the measurement zone 12 so that it is not required that the phase center of the antenna 28 of the device under test 26 coincidences with the center 30 of the measurement zone 12 which is cumbersome to realize. Thus, re-positioning the device under test 28 prior to starting the over-the-air measurements is no more required. In addition, the testing facilities can be simplified since the size of the testing facilities can be reduced which also decreases the costs for the testing.

Various components, including the processing unit 18, the control unit 20, and/or the processing and control device, may include, in some embodiments, logic for implementing the technologies and methodologies described herein. This logic can be carried out in either hardware or software, or a combination of hardware and software. In some embodiments, the control unit 20 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In some embodiments, one or more of these components includes hardware circuit implementations (e.g., implementations in analog circuitry, implementations in digital circuitry, and the like, and combinations thereof) to cause a device to perform one or more methodologies or technologies described herein. In other embodiments one or more of these components includes combinations of circuits and computer program products having software or firmware instructions stored on one or more computer readable memories that work together to cause a device to perform one or more methodologies or technologies described herein.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A method for performing active over-the-air measurements of a device under test with an antenna, comprising:
providing the device under test with the antenna;
arranging the device under test randomly in a measurement zone assigned to a measurement antenna;
determining the phase center of the antenna of the device under test; and
calculating measurement positions for the active over-the-air measurements that depend on an offset between the phase center determined and a center of the measurement zone.

2. The method according to claim 1, wherein a correction factor depending on the geometric path length between the measurement antenna and the antenna of the device under test is determined.

3. The method according to claim 2, wherein the correction factor is applied to compensate for the offset between the phase center determined and the center of the measurement zone.

4. The method according to claim 1, wherein a minimum far-field distance of the antenna of the device under test is determined.

5. The method according to claim 4, wherein the minimum far-field distance determined is compared with a minimum distance between the antenna of the device under test and the measurement antenna.

6. The method according to claim 1, wherein the relative position and/or the relative orientation of the measurement antenna with respect to the device under test placed in the measurement zone is varied during the active over-the-air measurements.

7. The method according to claim 6, wherein the relative angular orientation of the measurement antenna with respect to the device under test placed in the measurement zone is varied during the active over-the-air measurements.

8. The method according to claim 7, wherein azimuth and/or elevation is varied during the active over-the-air measurements.

9. The method according to claim 1, wherein the measurement positions establish a measurement grid.

10. The method according to claim 1, wherein the measurement positions calculated differ from each other in at least one of azimuth and elevation.

11. The method according to claim 1, wherein the phase center of the antenna of the device under test is determined by measuring a two-dimensional and/or a three-dimensional pattern.

12. A measurement system for over-the-air measurements of a device under test with an antenna, comprising a measurement zone, a measurement antenna assigned to the measurement zone, a positioning system and a processing unit,
wherein the positioning system is configured to vary the relative position and/or the relative orientation of the measurement antenna with respect to the device under test placed in the measurement zone;
wherein the processing unit includes circuitry configured to determine the phase center of the antenna of the device under test; and
wherein the processing unit includes circuitry configured to calculate measurement positions for the active over-the-air measurements of the device under test, which depend on an offset between the phase center determined and a center of the measurement zone.

13. The measurement system according to claim 12, wherein the processing unit is connected with the measurement antenna so that the processing unit receives measurement data from the measurement antenna.

14. The measurement system according to claim 12, wherein the processing includes circuitry configured to process the measurement data received in order to determine the phase center of the antenna of the device under test.

15. The measurement system according to claim 12, wherein the positioning system is configured to vary the relative angular orientation between the measurement antenna and the device under test placed in the measurement zone.

16. The measurement system according to claim 12, wherein the positioning system comprises a rotating disc assigned to the measurement zone and/or a rotating gantry arm assigned to the at least one measurement antenna.

17. The measurement system according to claim 12, wherein the processing includes circuitry configured to determine and to apply a correction factor depending on a geometric path length between the measurement antenna and the antenna of the device under test, wherein the geometric path length depends on measured measurement values.

18. The measurement system according to claim 12, wherein the processing includes circuitry configured to determine a minimum far-field distance of the antenna of the device under test.

19. The measurement system according to claim 18, wherein the processing includes circuitry configured to compare the minimum far-field distance determined with a minimum distance between the antenna of the device under test and the measurement antenna.

20. A method for performing active over-the-air measurements of a device under test with an antenna, comprising:
providing the device under test with the antenna;
arranging the device under test randomly in a measurement zone assigned to a measurement antenna;
determining the phase center of the antenna of the device under test; and
calculating measurement positions for the active over-the-air measurements that depend on an offset between the phase center determined and a center of the measurement zone,
wherein the measurement positions calculated are spaced from each other in a non-equidistant manner.

21. The method of claim 20, wherein angular distances between adjacent measurement positions vary.

* * * * *